(12) United States Patent
Köllner et al.

(10) Patent No.: US 7,463,984 B2
(45) Date of Patent: Dec. 9, 2008

(54) CIRCUIT ARRANGEMENT INCLUDING A SELF-DIAGNOSIS SYSTEM FOR TRIGGERING AND MONITORING A LOAD IN A BRIDGE CIRCUIT AND ASSOCIATED OPERATING METHOD

(75) Inventors: Wolfgang Köllner, Vienna (AT); Rudolf Liberda, Vienna (AT); Ludwik Waskiewicz, Vösendorf (AT)

(73) Assignee: Siemens Aktiengesellschaft, Munich (DE)

( * ) Notice: Subject to any disclaimer, the term of this patent is extended or adjusted under 35 U.S.C. 154(b) by 137 days.

(21) Appl. No.: 11/424,144

(22) Filed: Jun. 14, 2006

(65) Prior Publication Data

US 2006/0294425 A1    Dec. 28, 2006

(30) Foreign Application Priority Data

Jun. 17, 2005    (DE)    ............... 10 2005 028 184

(51) Int. Cl.
*G06F 11/00*    (2006.01)
(52) U.S. Cl. .................. 702/58; 702/57; 702/59; 702/60; 323/237; 323/239; 363/98; 714/30; 330/10; 330/251
(58) Field of Classification Search .................. 702/57, 702/58, 59, 60, 64, 65, 72; 323/237, 220, 323/223, 239, 222, 240, 241, 242, 243, 252; 363/89, 85, 98, 84, 137, 128; 307/64; 361/93.1; 714/30; 330/10, 251
See application file for complete search history.

(56) References Cited

U.S. PATENT DOCUMENTS

| | | | | |
|---|---|---|---|---|
| 3,984,753 A | * | 10/1976 | Uchida et al. ............... | 363/124 |
| 4,520,438 A | * | 5/1985 | Norton ........................ | 363/98 |
| 4,901,366 A | * | 2/1990 | Rottger ...................... | 388/811 |
| 5,486,993 A | * | 1/1996 | Sakurai et al. ............... | 363/98 |
| 5,729,120 A | * | 3/1998 | Stich et al. .................. | 323/237 |
| RE35,806 E | * | 5/1998 | Rossi et al. ................. | 318/293 |
| 6,198,231 B1 | * | 3/2001 | Schemmel et al. .......... | 315/225 |
| 6,232,781 B1 | | 5/2001 | Göser et al. ................ | 324/422 |
| 6,377,482 B1 | * | 4/2002 | Kolar et al. .................. | 363/84 |
| 6,556,053 B2 | * | 4/2003 | Stanley ...................... | 327/108 |
| 6,603,221 B1 | * | 8/2003 | Liu ............................ | 307/125 |
| 6,617,754 B1 | * | 9/2003 | Knauss ................... | 310/316.02 |
| 6,646,843 B1 | | 11/2003 | Newman et al. ............. | 361/65 |

FOREIGN PATENT DOCUMENTS

| | | |
|---|---|---|
| DE | 197 23 456 A1 | 12/1998 |
| EP | 0 571 657 B1 | 12/1999 |

\* cited by examiner

*Primary Examiner*—Carol S Tsai
(74) *Attorney, Agent, or Firm*—Baker Botts L.L.P.

(57) ABSTRACT

A circuit arrangement for triggering and monitoring a load which is connected in the shunt arm of a bridge circuit, including a control circuit for triggering switch elements S1 to S4 of the bridge circuit and a self-diagnosis system for testing the load connections, wherein the self-diagnosis system consists of

- a self-diagnosis circuit including a storage element for storing electrical charges, said circuit being linked to a signal connection of the control circuit, which signal connection is switchable as input or output, and to a load connection, and
- a self-diagnosis program which is stored in a memory of the control circuit and switches the signal connection to output during a first phase of the test in order to charge the storage element and switches the signal connection to input during a second phase of the test in order to capture the charge status of the storage element.

17 Claims, 2 Drawing Sheets

CIRCUIT ARRANGEMENT INCLUDING A SELF-DIAGNOSIS SYSTEM FOR TRIGGERING AND MONITORING A LOAD IN A BRIDGE CIRCUIT AND ASSOCIATED OPERATING METHOD

PRIORITY

This application claims priority from German Patent Application No. DE 10 2005 028 184.2, which was filed on Jun. 17, 2005, and is incorporated herein by reference in its entirety.

TECHNICAL FIELD

The invention relates to a circuit arrangement for triggering and monitoring a load which is connected in the shunt arm of a bridge circuit, including a control circuit for triggering switch elements of the bridge circuit and a self-diagnosis system for testing the load connections.

BACKGROUND

Various circuit arrangements for triggering a load which is connected in the shunt arm of a bridge circuit are known from power electronics. In vehicle engineering, such circuits are used for auxiliary drives e.g. for electric window winders, sunroof adjustments, seat adjustments and actuators for headlamp cleaning systems. In modern motor vehicles these circuits are expected to include self-diagnosis functionality. Before the circuit is activated, such a self-test should detect whether there is a short circuit from load leads to ground or supply voltage, or a break in the connection cables (open-load detection).

The circuit-based implementation of the self-diagnosis functionality can be designed such that, for example, the current or the voltage in the shunt arm of the H circuit is measured and this status information is supplied to the control circuit. A further possible solution could consist in using semiconductor switches which are capable of self-diagnosis in the bridge circuit, whose status information is again supplied to the control circuit and is analyzed by a test program which is stored there.

Both solution options have the disadvantage that each feedback of status information occupies a signal connection in each case. This involves corresponding cost overheads in relation to the control circuit. If the control circuit consists of a microcontroller, a specific type is predetermined by the number of I/O pins which are occupied for testing purposes. This type also implies a specific size, which is disadvantageous in particular if the electronic components of the control circuit and the switch elements of the bridge circuit and the actuator must be miniaturized.

SUMMARY

The invention addresses the problem of specifying a circuit arrangement in which a self-diagnosis occupies as few signal connections as possible on the control circuit, such that a short-circuit diagnosis and/or an open-load detection can be performed in the simplest possible manner. It should be possible to manufacture the circuit at minimum cost. The invention also addresses the problem of specifying an operating method for such a circuit arrangement.

This problem can be solved a circuit arrangement for triggering and monitoring a load which is connected in the shunt arm of a bridge circuit, comprising a control circuit for triggering switch elements of the bridge circuit and a self-diagnosis system for testing the load connections, wherein the self-diagnosis system comprises a self-diagnosis circuit comprising a storage element for storing electrical charges, the circuit being linked to a signal connection of the control circuit, which signal connection is switchable as input or output, and to a load connection, and a self-diagnosis program which is stored in a memory of the control circuit and switches the signal connection to output during a first phase of the test in order to charge the storage element and switches the signal connection to input during a second phase of the test in order to capture the charge status of the storage element.

The storage element can be designed as a capacitor. The self-diagnosis circuit may consist of resistors and capacitors. The circuit arrangement may further comprise a self-diagnosis circuit comprising a parallel connection of a first ohmic resistor with a capacitor, a second ohmic resistor which is connected at one end to the signal connection of the control circuit and at its other end to the parallel circuit and a junction point of the bridge circuit. The value of the first and the second resistor can be selected to be higher than the ohmic resistance value of the load. The test of the load connections can be carried out before the load is triggered. The second phase can be carried out immediately after the first phase of the test.

The object can also be achieved by an operating method for a circuit arrangement for triggering and monitoring a load which is connected in the shunt arm of a bridge circuit, comprising a control circuit for triggering switch elements of the bridge circuit and a self-diagnosis system for testing the load connections, and a self-diagnosis circuit being linked to a signal connection of the control circuit, the method comprising the following steps are carried out in order to detect a short-circuit:

opening the switch elements of the bridge circuit;
switching signal connection to input and reading in the voltage;
switching signal connection to output and outputting an output signal during an output time;
switching signal connection to input and reading in and analyzing the input signal level which is present during an input time.

Furthermore, the object can be achieved by an operating method for a circuit arrangement as described above, in which the following steps are carried out in order to detect an open-load state:

opening the switch elements of the bridge circuit;
closing a switch element of the bridge circuit, which switch element joins to ground and is not linked to the self-diagnosis circuit;
switching signal connection to output and outputting an output signal during an output time;
switching signal connection to input and reading in and analyzing the input signal level which is present during an input time.

The output time can be selected to be greater than the charge time constant. The input time can be selected to be smaller than the discharge time constant. The short-circuit detection and the detection of an open-load state can be carried out consecutively and before the switch elements of the bridge circuit are triggered. The output time can be selected to be approximately three times the discharge time constant.

According to the invention, provision is made for a self-diagnosis system comprising a self-diagnosis circuit as a hardware component and a self-diagnosis program as a software component. The self-diagnosis circuit links a signal connection of the control circuit to a connection of the load. The self-diagnosis program predetermines the test procedure and is stored in a memory of the control circuit. The self-diagnosis circuit contains a storage element for storing electrical charges. This is charged during a first phase of the test procedure by an output signal which is present at the signal connection for a predeterminable time. During a second phase of the test procedure, in which the signal connection is switched as input, the charge status of the storage element is captured and analyzed by the self-diagnosis program.

By introducing the storing element, it is possible to carry out both the stimulation of the circuit to be tested and the reading back of the status information using a single connection of the control circuit. This simplifies the control circuit. It can be designed comparatively economically. If a microcontroller is used for the circuit-based implementation, a smaller and therefore more economical type can be selected. Such a type requires comparatively smaller structural dimensions and this is advantageous for the miniaturization.

A storage element for storing electrical charges is simply provided in the form of a conventional capacitor.

The self-diagnosis circuit can be implemented inexpensively using a network of components consisting of ohmic resistors and capacitors.

A preferred embodiment of the self-diagnosis circuit consists of a parallel connection of a first ohmic resistor with a capacitor and a second ohmic resistor. In this case, the second ohmic resistor is connected at one end to the signal connection and at its other end to a junction point of a halfbridge.

In this case, it is appropriate if the value of the first and the second resistor is selected to be higher than the ohmic resistance value of the load.

In order to prevent a thermal overloading of the switch elements of the bridge, provision is made for the test procedure to be carried out before the load is triggered.

For reliable detection of a fault status of the circuit, it is advantageous if the charge status of the capacitor is read back immediately after the charge procedure.

In order to charge the capacitor as fully as possible, the output signal must be present at the signal connection of the control circuit for a specific time period. The output time is advantageously selected to be approximately three times the charge time constant.

The charge status of the stimulated capacitor is preferably captured immediately after charging. This capture preferably takes place during a time interval which is very much shorter than the discharge time constant of the self-diagnosis circuit. This time interval is also designated as input time in the following.

BRIEF DESCRIPTION OF THE DRAWINGS

In order to clarify the invention further, reference is made in the following part of the description to the drawings from which further advantageous configurations, details and effects of the invention can be derived, wherein.

DETAILED DESCRIPTION

Figure 1:
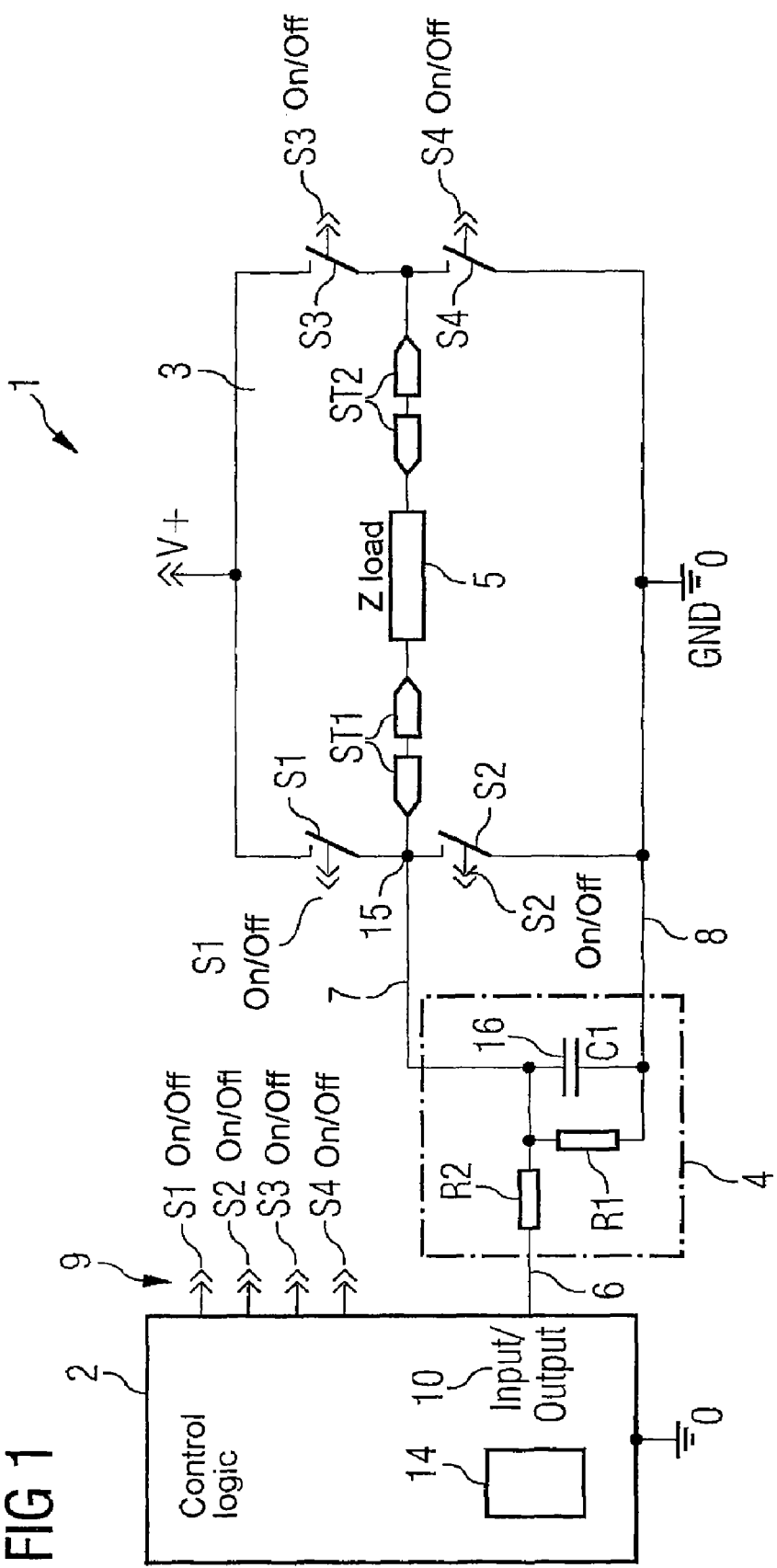
FIG. 1 shows a circuit diagram of an exemplary embodiment of the circuit arrangement according to the invention.

FIG. 1 shows a circuit diagram of an exemplary embodiment of the circuit arrangement 1 according to the invention. It consists of a control circuit 2 (control logic) which features signal outputs 9 for triggering switch elements S1, S2, S3 and S4 of a bridge circuit or H circuit 3. (The linking cables between the signal outputs 9 and the switch elements S1 to S4 are omitted in FIG. 1 for the sake of clarity). The bridge circuit 3 is linked to V+ and to GND of a D.C. voltage source which is not shown in further detail. There is a load 5 in the shunt arm of the H circuit 3. This load 5 is symbolized generally in FIG. 1 by means of the circuit diagram symbol of a complex load resistance (Z load).

The circuit 1 is utilized in motor vehicles e.g. for power-driven window winders, sunroof adjustments and seat adjustments, i.e. instead of the complex load 5 a commutator motor is conceived whose connection cables are linked via plug contacts ST1 and ST2 to the switch elements S1, S2 of the left-hand halfbridge or S3, S4 of the right-hand halfbridge in the specific example.

Such an electronic circuit is exposed to harsh operating conditions in a motor vehicle. The fault can arise that the load leads join to ground potential or to the supply voltage potential in the bridge circuit 3 as a result of a short circuit. If the switch elements of the bridge circuit 3 are triggered by the control circuit 2 in the event of a short circuit, the through-connection results in undesired current peaks. These current peaks can result in the overloading of the switch elements if no overload protection is provided. Another fault might be characterized in that one or both motor leads are broken. If the current path of the electric motor is broken, the drive does not carry out the adjustment. This remains unnoticed by the control circuit. In the present application for an auxiliary drive in a motor vehicle, a self-check of the circuit is therefore required.

In accordance with the invention, in order to solve this problem, the invention provides for a self-diagnosis system which carries out a test before it becomes operational. It consists of hardware components and software components, i.e. a self-diagnosis circuit 4 and a self-diagnosis program. The self-diagnosis program is stored in a read-only memory 14 of the control circuit 2. In addition to the signal outputs 9 for triggering the switch elements S1 to S4, the control circuit 2 has a signal connection 10 which is managed by this self-diagnosis program. The connection 10 can be switched as either input or output. As shown in the circuit diagram, the self-diagnosis circuit 4 is linked to the signal connection 10 via the cable 6 and to the bridge circuit 3 via the cables 7, 8. The self-diagnosis circuit 4 which is delimited by a broken line in FIG. 1 includes a parallel connection comprising a first resistor R1 and a capacitor C1. On one side, this parallel connection is linked to the signal connection 10 of the control logic 2 by the resistor R2 and the cable 6. The cable 7 links this parallel connection R1/C1 to the junction 15 of the left-hand halfbridge. The other end of the parallel connection is linked to ground potential (GND) of the bridge circuit 3 by the cable 8.

In the following description of the operating method, it is assumed that the resistance of the load 5 is very much smaller than the value of the ohmic resistors R1, R2.

Figure 2:
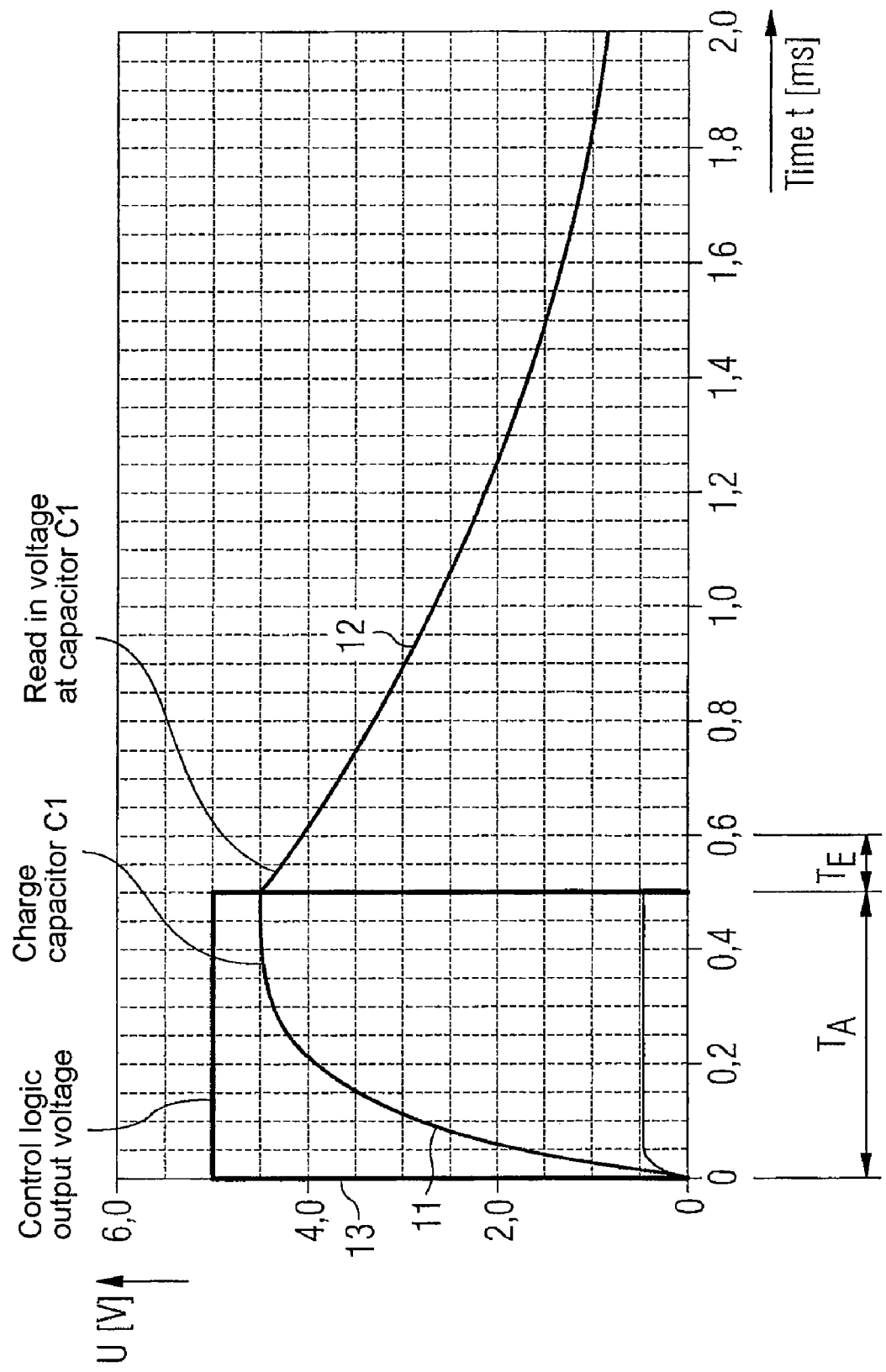
FIG. 2 shows a time-dependent illustration of the voltage at the signal connection of the control circuit and the voltage at the capacitor.

For a better understanding of the process description, reference is made to FIG. 2 in which the time-linked profile of the output signal voltage 13 is shown as a function of the time in a diagram, together with the voltage profile 11 when the capacitor C1 is charged and the voltage profile 12 when the capacitor C1 is discharged. The output time is designated as TA and the input time is designated as TE in FIG. 2.

In order to detect a short circuit, the switches S1 to S4 are triggered by the signal outputs 9 such that each of these switches S1 to S4 opens (FIG. 1). The signal connection 10 is then switched to input and the self-diagnosis program reads the potential which is present at the signal connection 10. If this voltage potential joins to ground, there is no short circuit of the motor connections ST1, ST2 with the positive pole of the supply voltage. This means that ST1 and ST2 are not directly linked to V+. In a third step, the signal connection 10 is switched to output and a pulse-form output signal voltage 13 ("high") is output during an output time TA (FIG. 2). The output time TA totals approximately three times the charge time of the capacitor C1. The capacitor C1 is charged via the resistor R2. In a fourth step which follows this charge procedure, the signal connection 10 is switched back to input. Now the potential which is present at the signal connection 10 is again read into the control logic 2 and analyzed during an input time TE. If the analysis shows that the potential which has been read in is "high", there is no short circuit from the plug contacts ST1 or ST2 to ground (GND). If there was a short circuit from the plug contacts ST1 or ST2 to ground potential, it would not be possible to charge the capacitor C1 via the output signal voltage 13.

In order to check for a break in the connection cables of the load 4 (open-load detection), a first method step proceeds analogously to the short-circuit diagnosis above, i.e. the signal outputs 9 of the control circuit again trigger the switches S1 to S4 such that each of these switches opens. In a second method step, the switch 4 is then closed. In a third step, the signal connection 10 of the control circuit 2 is again switched to output and an output signal voltage 13 is output during an output time TA (FIG. 2). (The output time again corresponds to approximately three times the charge time constant). As a consequence, the capacitor C1 is charged via the resistor R2 (in FIG. 2: "Charge capacitor C1"). In a fourth method step, the signal connection 10 is now switched back to input (in FIG. 2: "Read in voltage at capacitor C1"). The voltage level which is present at pin 10 is read in during the input time TE. The self-diagnosis program analyzes the voltage level which has been read in by comparing it with a reference value that is predetermined internally in the test program. If the voltage value which has been read in is "high" at pin 10, a connection cable to the load is broken, i.e. the self-check has detected an open-load state. Conversely, if the voltage potential which has been read in is "low", the load is correctly connected, i.e. no connection cables are broken. (The same would apply correspondingly for another circuit design which is not shown, in which the link cable 7 links the diagnosis circuit not to the junction of the left-hand halfbridge 15 but to the junction of the right-hand halfbridge. In this case, switch 2 instead of switch 4 would be closed in the second method step).

In the event that no load short circuit is present, the charge time constant is calculated from the product of the parallel connection R1//R2 and the capacitance value of the capacitor C1:

$$\tau\text{charge} = (R1//R2)C1.$$

The discharge time constant for C1 without a load short circuit is derived from the product of the resistance value R1 and the capacitance value C1:

$$\tau\text{discharge} = R1*C1.$$

In this way, the self-diagnosis program which is stored in the memory of the microcontroller can not just detect an error in the bridge circuit 3, but also assign it individually to a fault pattern. Depending on whether it is a short circuit or a break in the load leads, corresponding measures can be taken in the subsequent program sequence. These measures can consist in, for example, not through-switching the switch elements S1 to S4 in the bridge circuit 3 or displaying the error status in a display panel in the event of a short circuit. Depending on whether it is a safety-critical auxiliary drive or a less significant auxiliary drive, the display can indicate that although a visit to a workshop should be made the journey can continue, or that the journey must be suspended immediately and a workshop must be notified. The result of the "on-board diagnosis" can also be stored in an error log, however. The information from this error log can then be analyzed subsequently as part of periodic vehicle monitoring in the context of an "off-board diagnosis" by an external conventional diagnosis device. In this way, the diagnosis device can then differentiate between sporadic and permanent errors.

As a result of introducing a storage element (capacitor C1 in FIG. 1) in accordance with the invention, the stimulation of the circuit and the reading back of the status information from the storage element can be done via a single switchable input/output (I/O pin) of the control logic. In comparison with the prior art, only this one signal connection 10 is therefore required for the self-test. This simplifies the control circuit 2. In comparison with the prior art, the number of I/O pins required for diagnostic purposes decreases to a single connection. It is therefore possible to select a much smaller and cheaper microcontroller. This is a crucial advantage when manufacturing large numbers of units. The comparatively small structural dimensions favor the miniaturization of the circuit arrangement 1, this being particularly advantageous if electronics and actuator are developed as a mechatronic module.

The test program sequence according to the invention is performed by the circuit independently before the auxiliary drive is activated, i.e. before moving off (after "ignition on" and starting the engine). An overload of the switch elements due to short circuit does not occur.

In the present application scenario of a motor vehicle auxiliary drive, the control circuit 2 is implemented as a microcontroller on a chip. The switch elements S1 to S4 are power semiconductors in the present embodiment. However, they can also directly form contacts of a mechanical switching relay.

Of course, the control circuit 2 can also be implemented using an ASIC or using digital modules of a control logic in SMD for example. The switch elements S1 to S4 can also be implemented as semiconductor switches.

Of course, the above-described mode of operation is not restricted to the specific exemplary embodiment. It can easily be extended to arrangements comprising a plurality of bridges. As mentioned above, the general representation of the load 4 as a complex resistance Z is intended to express that the invention can also be used on other power-electronic circuits in which self-diagnosis functionality is required, in particular on circuits comprising a plurality of bridges.

LIST OF REFERENCE NUMERALS

1 Circuit arrangement
2 Control circuit
3 Bridge circuit, H circuit
4 Self-diagnosis circuit
5 Load (electromotor)
6, 7, 8 Cable
9 Output signal cable connection
10 Input-output signal cable connection, signal connection
11 Voltage profile when charging the capacitor
12 Voltage profile when discharging the capacitor
13 Output signal voltage
14 Memory for the self-diagnosis program
15 Junction of the left-hand halfbridge
16 Storage element, capacitor

What is claimed is:

1. A circuit arrangement for detecting malfunction of a bridge circuit having a load connected in a shunt arm of said bridge, said circuit arrangement comprising a control circuit for triggering switch elements of the bridge circuit and a self-diagnosis system, wherein the self-diagnosis system comprises:

a self-diagnosis circuit comprising a storage element for storing electrical charges, wherein the storage element is coupled with a signal connection of the control circuit, which signal connection is switchable as input or output, and with at least one load connection of said shunt arm, and said control circuit being operable to switch the signal connection to output during a first phase of a test in order to charge the storage element and switches the signal connection to input during a second phase of the test in order to capture the charge status of the storage element.

2. A circuit arrangement according to claim 1, wherein the storage element is designed as a capacitor.

3. A circuit arrangement according to claim 2, wherein the self-diagnosis circuit consists of resistors and capacitors.

4. A circuit arrangement according to claim 3, comprising the self-diagnosis circuit comprises a parallel connection of a first ohmic resistor with a capacitor, a second ohmic resistor which is connected at one end to the signal connection of the control circuit and at its other end to the parallel circuit and a junction point of the bridge circuit.

5. A circuit arrangement according to claim 4, wherein the value of the first and the second resistor is selected to be higher than the ohmic resistance value of the load.

6. A circuit arrangement according to claim 1, wherein the test of the load connections is carried out before the load is triggered.

7. A circuit arrangement according to claim 1, wherein the second phase is carried out immediately after the first phase of the test.

8. An operating method for detecting a short-circuit in a bridge circuit comprising a plurality of switch elements and a load connected in a shunt arm of said bridge, wherein a control circuit can control switch elements of the bridge circuit and a self-diagnosis circuit is coupled between a signal connection of the control circuit and said shunt arm, the method comprising the following steps:

opening the switch elements of the bridge circuit;

switching a function of said signal connection to input and reading in the voltage;

switching the function of said signal connection to output and outputting an output signal during an output time;

switching the function of said signal connection to input and reading in and analyzing the input signal level which is present during an input time.

9. An operating method according to claim 8, wherein the output time is selected to be greater than the charge time constant.

10. The An operating method according to claim 8, wherein the input time is selected to be smaller than the discharge time constant.

11. An operating method according to claim 8, wherein the short-circuit detection and the detection of an open-load state are carried out consecutively and before the switch elements of the bridge circuit are triggered.

12. An operating method according to claim 9, wherein the output time is selected to be approximately three times the discharge time constant.

13. An operating method for detecting an open-load state in a bridge circuit comprising a plurality of switch elements and a load connected in a shunt arm of said bridge, wherein a control circuit can control switch elements of the bridge circuit and a self-diagnosis circuit is coupled between a signal connection of the control circuit and said shunt arm, the method comprising the following steps:

opening the switch elements of the bridge circuit;

closing a switch element of the bridge circuit, which switch element joins to ground and is not linked to the self-diagnosis circuit;

switching a function of said signal connection to output and outputting an output signal during an output time;

switching the function of said signal connection to input and reading in and analyzing the input signal level which is present during an input time.

14. An operating method according to claim 13, wherein the output time is selected to be greater than the charge time constant.

15. An operating method according to claim 13, wherein the input time is selected to be smaller than the discharge time constant.

16. An operating method according to claim 13, wherein the short-circuit detection and the detection of an open-load state are carried out consecutively and before the switch elements of the bridge circuit are triggered.

17. An operating method according to claim 14, wherein the output time is selected to be approximately three times the discharge time constant.

* * * * *